(12) United States Patent
Prat et al.

(10) Patent No.: US 8,975,815 B2
(45) Date of Patent: Mar. 10, 2015

(54) METHOD FOR MAKING AN ELECTRONIC DISPLAY DEVICE COVERED BY A PROTECTION PLATE

(75) Inventors: Christophe Prat, Coueron (FR); Tony Maindron, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 1237 days.

(21) Appl. No.: 12/812,321

(22) PCT Filed: Jan. 12, 2009

(86) PCT No.: PCT/FR2009/000034
§ 371 (c)(1),
(2), (4) Date: Sep. 28, 2010

(87) PCT Pub. No.: WO2009/106768
PCT Pub. Date: Sep. 3, 2009

(65) Prior Publication Data
US 2011/0032177 A1 Feb. 10, 2011

(30) Foreign Application Priority Data
Jan. 18, 2008 (FR) .................................... 08 00262

(51) Int. Cl.
*H01J 1/62* (2006.01)
*H01J 63/04* (2006.01)
*H01L 27/32* (2006.01)
*H01L 51/52* (2006.01)
*H01L 51/56* (2006.01)

(52) U.S. Cl.
CPC ........ *H01L 27/3276* (2013.01); *H01L 51/5246* (2013.01); *H01L 51/56* (2013.01); *H01L 2251/566* (2013.01)
USPC ........... 313/512; 313/483; 313/500; 313/501; 313/502; 313/503; 313/504; 313/505; 313/510; 313/511

(58) Field of Classification Search
None
See application file for complete search history.

(56) References Cited

U.S. PATENT DOCUMENTS

2006/0135029 A1 6/2006 Harada
2006/0220550 A1 10/2006 Harada

FOREIGN PATENT DOCUMENTS

JP 2004 247239 A 9/2004

OTHER PUBLICATIONS

Grozea, D. et al., *Enhanced thermal Stability in Organic Light-Emitting Diodes Through Nonocomposite Buffer Layers at the Anode/Organic Interface*, J. Appl. Phys. 101, 033522, (2007) pp. 1-6
International Search Report and Written Opinion for Application No. PCT/FR2009/000034 dated Oct. 22, 2009.

*Primary Examiner* — Natalie Walford
(74) *Attorney, Agent, or Firm* — Alston & Bird LLP

(57) ABSTRACT

The invention relates to a method for making an electronic display device (1) having a screen (3) covered by a protection plate, and to a substrate (2) covered by said screen for obtaining such a device. The method comprises the following steps: a) applying glue (10) at the non cross-linked state substantially on the entire surface of the screen and/or the assembling surface (11a) of the plate (11) following a deposit on the screen connection area (5) of at least one organic layer (15) for protecting the connection area from the glue; applying the assembling surface against the screen via the glue; c) emitting a radiation through the plate for cross-linking the glue; and d) removing a portion of the plate covering the connection area so that the latter can be electrically accessible, the protection layer being removed from the connection area upon said removal or during a further surface processing step. According to the invention, the protection layer contains at least one organic compound selected from the group comprising compounds derived from diamines and organometallic complexes with heterocycles.

20 Claims, 3 Drawing Sheets

METHOD FOR MAKING AN ELECTRONIC DISPLAY DEVICE COVERED BY A PROTECTION PLATE

FIELD OF THE INVENTION

The present invention relates to a method for fabricating an electronic display device having a display covered with a protective sheet, said sheet being optionally provided with optical color filters intended to cooperate with this display, and to a substrate coated with this display in order to obtain such a device. The invention applies in general to color or monochrome displays and, in particular, to compact display devices having a miniature display or microdisplay.

BACKGROUND OF THE INVENTION

As is known, display devices having a microdisplay, such as for example those based on OLEDs (organic light-emitting diodes), comprise an active zone formed from a matrix of pixels and an electrical connection zone which is placed so as to be adjacent this active zone and which typically comprises an alignment of electrical contacts. These microdisplay devices are fabricated by assembling optical color filters respectively on color dots of the pixels that form the active part of the microdisplay and that cover a semiconductor substrate, typically consisting of a silicon wafer. These filters are usually deposited on the internal face of a glass sheet which is bonded to the microdisplay so as to protect it, in the manner of an impermeable encapsulation, from the moisture and oxygen of the outside environment.

In general, this assembly is produced by applying an ultraviolet-crosslinkable adhesive film over the entire surface of the microdisplay or of the internal face of the protective sheet equipped with the filters, because it is technically difficult to apply this adhesive just to the active zone of the microdisplay. Now, as a result of bonding the protective sheet to the microdisplay and of crosslinking the adhesive by UV radiation through the sheet thus assembled, there is some cured adhesive covering the electrical contacts of the connection zone, thereby complicating the subsequent operation of "liberating" the contacts by cutting the sheet in line with the point of separation between the active zone and the connection zone.

To solve this problem of preserving the electrical contacts of the microdisplay thus covered with the protective sheet, in the past this crosslinkable adhesive has been especially applied:

in the form of a bead surrounding the active zone of the microdisplay as for example described in the document U.S. Pat. No. 6,825,612, with the resulting drawback that the microdisplay is imperfectly protected by the sheet; or selectively on this active zone by screen printing, which has the drawback of requiring a high degree of precision in applying the spots of adhesive; or by prestructuring the assembly face of the protective sheet in order to form therein cavities intended to face the electrical contacts and having a depth very much greater than the thickness of the applied adhesive film, so that the adhesive is lodged in these cavities, with as drawback the required prior step of structuring the sheet.

Document WO-A-2007/005228 provides a method of assembling a protective sheet provided with extensions or feet to be bonded to a microdisplay, this method comprising, in succession:

application of adhesive in the form of beads at the interface between these extensions of the sheet and the microdisplay;

deposition, on the external sides of these extensions, of a photosensitive resin of the Kapton® type followed by an inorganic sealing layer, especially one covering this resin; and then dissolution of this resin and of that part of the inorganic layer covering said resin, so as in the end to obtain only that part of said layer which is located over the thickness of the beads of adhesive and necessary for sealing the assembly.

A major drawback of the method described in the above document lies in the difficulty of implementing it due especially to the extensions of the protective sheet and to the required precision in applying the adhesive and the photosensitive resin along these extensions.

SUMMARY OF THE INVENTION

One object of the present invention is to provide a method for fabricating an electronic display device which remedies the abovementioned drawbacks, this device comprising a substrate coated on at least one of its sides with a display, such as a microdisplay, which comprises an active zone formed from a matrix of pixels and an electrical connection zone, the display being fastened by means of an adhesive which is crosslinkable by electromagnetic radiation, with a protective sheet which is permeable to this radiation and has a face for assembly with the display, this method comprising the following steps:

a) the adhesive is applied in the uncrosslinked state substantially over the entire surface of the display and/or of the assembly face of the protective sheet, after deposition on the connection zone of at least one organic layer for protecting this connection zone from the adhesive;

b) this assembly face is applied against the display via this adhesive;

c) said radiation is emitted through the protective sheet in order to crosslink the adhesive; and then d) a portion of the protective sheet covering the connection zone is removed for the purpose of making said zone electrically accessible, the protective layer being pulled off the connection zone by this removal or else removed by a subsequent surface treatment step.

For this purpose, the method according to the invention is such that said protective layer is based on at least one organic compound chosen from the group consisting of diamine-derived compounds and heterocyclic organometallic complexes.

It should be noted that this organic protective layer enables the electrical contacts of the connection zone to be protected from the solvent of the adhesive and from the ambient moisture, while still being able to be easily removed during or after the operation of cutting the sheet in line with the point of separation between the active zone and the connection zone in order to liberate these electrical contacts.

It should also be noted that by effectively protecting the connection zone with this organic layer according to the invention it is possible for the adhesive to be easily applied over the entire surface of the display and/or of the internal face of the protective sheet, in comparison with applying it selectively in the form of beads of adhesive, as used in the aforementioned prior art.

Advantageously, said protective layer has a sufficiently low adhesion to the connection zone so as to be able to be removed directly by mechanical tearing in the aforementioned step d) together with said portion of the sheet covered with the adhesive.

As a variant, said protective layer may be removed by a step of dissolving it after step d) by means of a solvent appropriate to this layer, for example, but nonlimitingly, acetone, an alcohol or even water.

According to one other feature of the invention, said or each organic compound of said protective layer forms part of the composition of the or each display of the display device.

It should be noted that this use of a current material, already used for producing the display, during assembly requires no additional fabrication step.

Advantageously, said protective layer may have a thickness of between 5 nm and 100 nm and it is deposited by an evaporation technique or a liquid technique.

Preferably, said protective layer may consist of or be based on:

a diamine derivative chosen from the group consisting of N,N'-diphenyl-N,N'-bis(1-naphthyl)-(1,1'-bisphenyl)-4,4'-diamine (NPB), N,N1-diphenyl-N,N'-bis(3-methylphenyl)-(1,1'-bisphenyl)-4,4'-diamine (TPD), 4,4'4"-tris(N-(1-naphthyl)-N-phenylamino)trisphenylamine (1T-NATA) and 4,4',4"-tris(N-(2-naphthyl)-N-phenylamino)trisphenylamine (2T-NATA);

an organometallic complex derived from quinoline or benzoquinoline, preferably chosen from the group consisting of tris(8-hydroxyquinolinato)aluminum(III) (Alq3), tris(8-hydroxyquinolinato)gallium(III) (Gaq3), tris(8-hydroxyquinolinato)indium(III) (Inq3), tris(5-methyl-8-quinolinolato)aluminum (Almq3), bis(10-hydroxybenzo[h]-quinolinato)beryllium (BeBq2) and biphenoxy-bi(8-quinolinolato)aluminum (BAlq); or else an organometallic complex having an oxazole-based or thiazole-based ligand, preferably bis[2-(2-hydroxyphenyl)benzoxazolato]zinc (Zn(BOX)2) and bis[2-(2-hydroxy-phenyl)benzothiazolato)zinc (Zn(BTZ)2).

Even more preferably, this protective layer consists of N,N'-diphenyl-N,N'-bis(1-naphthyl)-(1,1'-bisphenyl)-4,4'-diamine (NPB) or tris(8-hydroxyquinolinato)aluminum(III) (Alq3).

The expression "electronic display device" is understood, as is known, in the present description to mean any display, for example, but not limitingly, an LCD (liquid crystal display), an FED (field emission display) or an electroluminescent display. As regards the active zone of the or each display, it does not matter whether this is of the active or passive matrix type.

Advantageously, the or each display of the device fabricated by the method according to the invention is an electroluminescent microdisplay that may be of the organic or inorganic type, i.e. incorporating at least one organic (or alternatively inorganic) film between two, lower and upper, electrodes that serve respectively as anode and cathode for the device, at least one of said electrodes being transparent to the light emitted by this microdisplay.

Even more advantageously, the or each display is an OLED (organic light-emitting diode) microdisplay in which the organic protective layer according to the invention is based on at least one organic compound specifically used in this organic film.

It should be noted that the aforementioned list of organic compounds that can be used in the method according to the invention was given nonlimitingly, it being possible to use other compounds, particularly those of the HTL (hole transport layer), the EML (emitting layer) and the ETL (electron transport layer) of these OLED microdisplays.

As materials that can be used to produce said substrate and the protective sheet, mention may be made of, respectively, any semiconductor material, preferably silicon or silicon on glass, and any material permeable to said radiation and advantageously permeable to the light emitted by the display, such as glass or a plastic.

As regards the protective sheet, this may in the particular case of a color display be provided with optical color filters on its face for assembly with the display, in such a way that these filters are applied in the aforementioned step b) facing the corresponding color dots of each of the pixels of the display. It should be noted that the display of the device according to the invention need not require the addition of optical color filters to this protective sheet, which sheet would then allow the display to be simply encapsulated.

According to another feature of the invention, said connection zone of the or each display may be formed by at least one alignment of connectors, which is located to the outside of said active zone, for example close to a peripheral edge of the display.

The adhesive used in this method according to the invention may be any adhesive that can be crosslinked by electromagnetic radiation in the visible or invisible range such as, but not limitingly, ultraviolet radiation. This adhesive crosslinkable by such ultraviolet radiation may for example be an adhesive of the one-component or two-component acrylate or epoxy type.

A substrate for an electronic display device according to the invention, this substrate being coated on at least one of its sides with a display, such as an OLED (organic light-emitting diode) microdisplay, comprises an active zone formed from a matrix of pixels and an electrical connection zone, the display being intended to be fastened over substantially its entire surface via an adhesive which is crosslinkable by electromagnetic radiation, to a protective sheet which is permeable to this radiation and has an assembly face for assembly to the display, the connection zone being coated with at least one organic layer for protecting it from the adhesive as defined above, this layer being able to be removed directly from this connection zone by removing a portion of the protective sheet bonded to this zone or else by dissolution following this removal, in order to make this zone electrically accessible.

This substrate according to the invention is such that said protective layer is based on at least one organic compound chosen from the group consisting of diamine-derived compounds and heterocyclic organometallic complexes, this organic compound preferably being used in the composition of the or each display and this protective layer preferably having a sufficiently low adhesion to the connection zone and a thickness of between 5 nm and 100 nm.

As indicated above, said protective layer is deposited by an evaporation technique or a liquid technique and said or each organic compound is advantageously used in the composition of the or each display.

BRIEF DESCRIPTION OF THE DRAWINGS

Other advantages, features and details of the invention will emerge from the rest of the description that follows, with reference to appended drawings that are given solely by way of examples and in which.

DETAILED DESCRIPTION OF THE INVENTION

Figure 1:
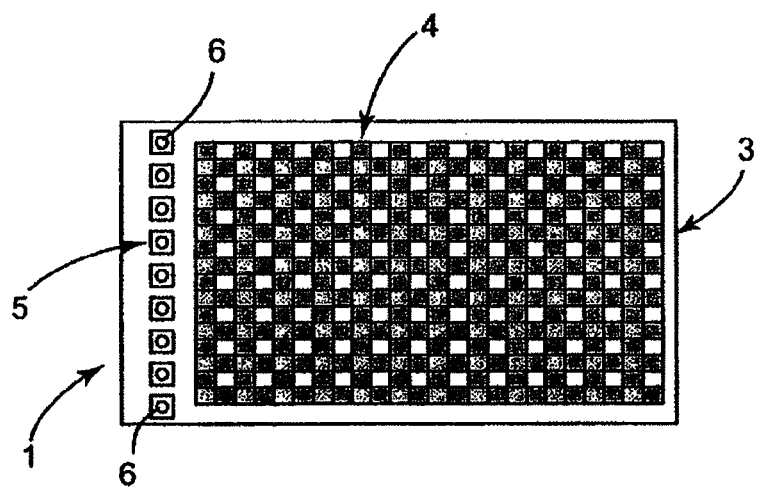
FIG. 1 is a schematic top view of the active and connection zones of a microdisplay of a display device according to the invention, which is intended to be covered with a protective sheet provided with color filters.

The color electronic display device 1 illustrated in FIG. 1 is in this example of the OLED type, comprising, in a known manner, a substrate 2, typically made of silicon or silicon on glass (see FIGS. 2 to 5), coated with a microdisplay 3 which comprises an active zone 4 formed from a matrix of pixels and an electrical connection zone 5 external to the active zone 4. The active zone 4 sits on top of an integrated circuit structure represented symbolically in FIGS. 2 to 5 by a source S, a gate G, a drain D, two transistors T1 and T2 and a capacitor "Capa". The connection zone 5 is for example formed from an alignment of electrical contacts 6 or connectors for establishing a potential difference between the electrodes 7 and 8 integrated into the microdisplay 3.

In this example of an OLED electroluminescent microdisplay 3 illustrated in FIGS. 2 to 5, an organic film 9 (either a monolayer or a multilayer) is inserted between the two electrodes, namely between the lower electrode 7 and the upper electrode 8, which serve respectively as anode and cathode for the device 1 and at least one electrode of which is transparent to the light emitted by the microdisplay 3 so as to radiate the light emitted to the outside by the device 1. As regards the organic intercalation film 9, this is designed to transfer the electrons and the holes which come from the electrodes 7 and 8 and are recombined to generate excitons, and therefore to emit light.

Figure 2:
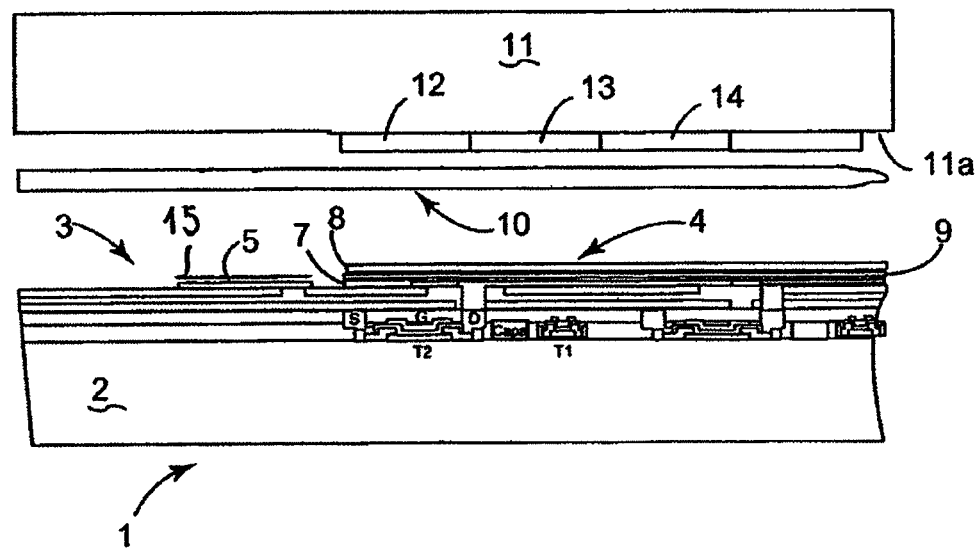
FIG. 2 is an exploded schematic view in cross section of a display device according to the invention showing the application of the crosslinkable adhesive to the sheet, for the purpose of assembling it to the microdisplay of FIG. 1, the connection zone of which has been covered beforehand with the organic protective layer according to the invention.
Figure 3:
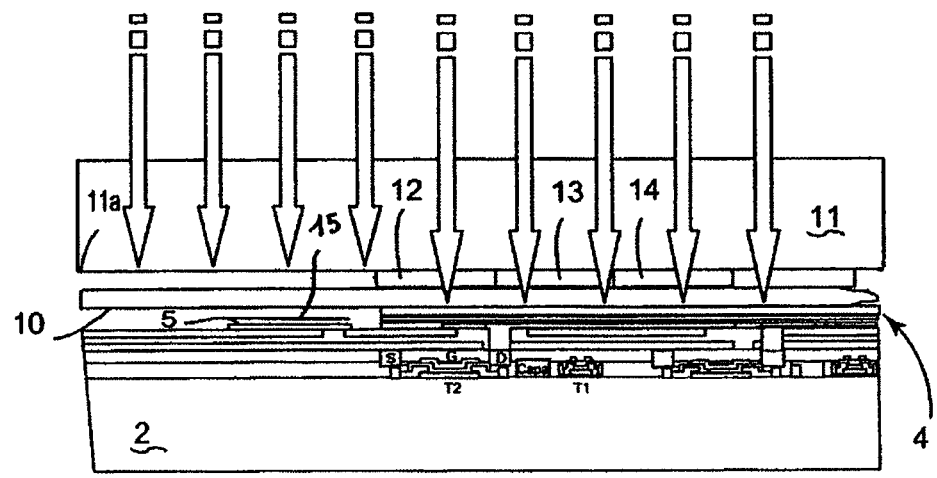
FIG. 3 is a schematic cross-sectional view of the display device of FIG. 2 showing the step of crosslinking the adhesive after the protective sheet has been brought into contact with the microdisplay.
Figure 4:
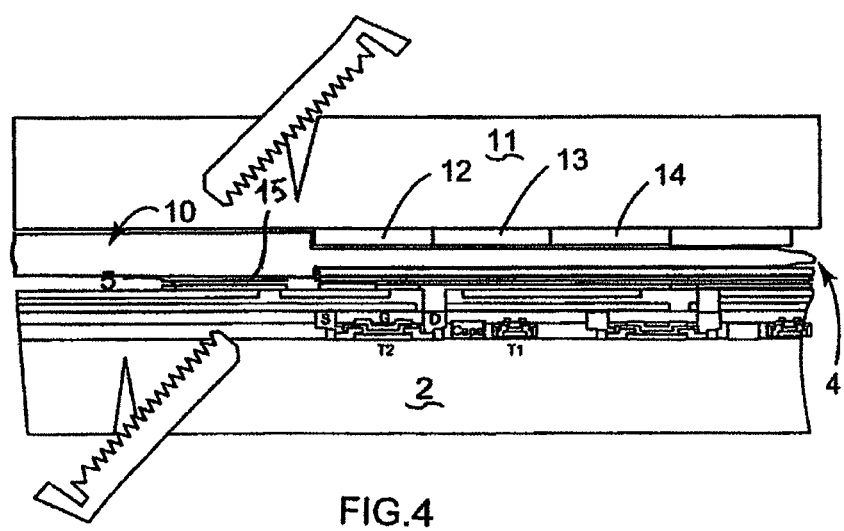
FIG. 4 is a schematic cross-sectional view of the device of FIG. 3 after this crosslinking step, showing the cutting of the substrate and the protective sheet in order to obtain the useful part of the microdisplay, liberating the access to the connection zone.

As illustrated in FIG. 2, before the step of assembling a protective sheet 1 to the microdisplay 3 via a UV-crosslinkable adhesive 10, according to the invention an inorganic protective layer 15 is deposited on the connection zone 5 of said microdisplay, especially a layer capable of protecting the electrical contacts 6 of the zone 5 from this adhesive 10 and from the ambient moisture.

As is known, the protective sheet 11 is intended to form an encapsulating cover, typically made of glass or plastic, which is permeable to the UV radiation, and also advantageously to the light emitted by the microdisplay 3 when emission takes place through this sheet 11, and which may be provided with color filters 12, 13 and 14 (red, green and blue filters) on its internal face 11a for assembly with the microdisplay 3 so that the filters 12 to 14 are applied against the respective color dots of each pixel of the active zone 4.

As UV-crosslinkable adhesive 10 that can be used, mention may for example be made of the following adhesives: DELO Katiobond 45952 (one-component epoxy); DELO Photobond 4302 (one-component acrylate); Dymax 425 (one-component acrylate); Dymax X-5,6-99-E (one-component acrylate); Dymax 628-VLV (one-component acrylate); Polytec PI OG146 (one-component epoxy); Polytec PI OG114-4 (one-component epoxy); Polytec PI 301-2, parts A and B (two-component epoxy); Polytec PI 301-2FL, parts A and B (two-component epoxy); Polytec PI OG142-13 (one-component epoxy); and Epotecni OAD061 (one-component epoxy).

As indicated above, the organic protective layer 15 according to the invention is designed to adhere sufficiently weakly to the connection zone 5 so as to be able to be removed directly by subsequent mechanical tearing of a portion of the protective sheet 11 covered with the adhesive 10 and/or to be able to be easily removed after this tearing, for example by dissolution using an appropriate solvent. This protective layer 15 is advantageously based on an organic compound already used to fabricate the microdisplay 3, for producing the electronic components for example, or as emissive material, and it is preferably based on an organic compound that may in particular be a compound derived from a diamine, such as for example, N,N'-diphenyl-N,N'-bis(1-naphthyl)-(1,1'-bisphenyl)-4,4'-diamine (NPB) or a heterocyclic organometallic complex such as, for example, tris(8-hydroxyquinolinato) aluminum(III) (Alq3).

Advantageously, said protective layer may have a thickness of between 5 nm and 100 nm and it is deposited by an evaporation technique. It is also possible to deposit the protective layer by a liquid technique, for example by inkjet printing.

After the step (illustrated in FIG. 3) of crosslinking the adhesive 10 separating the microdisplay 3 from the protective sheet 11, the structure is cut in line with the external edge of the connection zone 5. The protective sheet 11 may then be cut in line with and above the line separating the active zone 4 from the connection zone 5, in order to liberate the latter (see FIG. 4).

Figure 5:
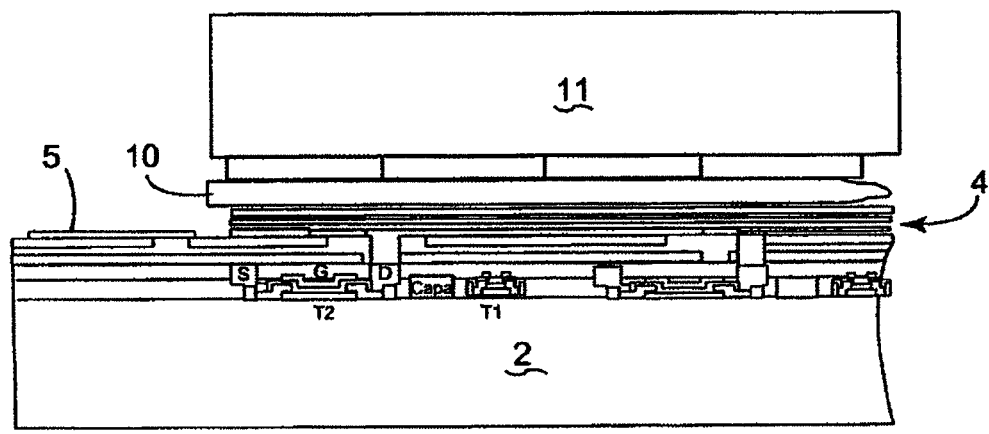
FIG. 5 is a schematic cross-sectional view of the device of FIG. 4 once it has been cut and the connection zone of the microdisplay thereof has been stripped of the organic layer.

If the organic layer 5 has been completely removed with the adhesive 10, during the removal of the thus cut portion of the protective sheet 11, thanks to its very weak adhesion to the connection zone 5, the device shown in FIG. 5 is obtained directly, in which this zone 5 is completely free for access to make the required electrical connections.

If this removal of the cut portion of the protective sheet 11 is not sufficient for this organic layer 15 to be completely removed, the residual layer is then eliminated, for example by dissolving it using a suitable solvent, such as acetone, an alcohol or water. This elimination may also be carried out using a laser or any other suitable technique.

It should be noted that the organic protective layer according to the invention makes it possible, in this manner, for the connection zone 5 of the microdisplay 3 to be effectively protected during assembly by bonding it to the protective sheet 11, without jeopardizing the subsequent accessibility of this zone 5 after the assembly operation.

The invention claimed is:

1. A method for fabricating an electronic display device comprising a substrate coated on at least one of its sides with a display, such as a microdisplay, which comprises an active zone formed from a matrix of pixels and an electrical connection zone, the display being fastened by means of an adhesive which is crosslinkable by electromagnetic radiation, with a protective sheet which is permeable to this radiation and has a face for assembly with the display, this method comprising the following steps:

a) the adhesive is applied in the uncrosslinked state substantially over the entire surface of the display and/or the assembly face of the protective sheet, after deposition on the connection zone of at least one organic layer for protecting this connection zone from the adhesive;

b) this assembly face is applied against the display via this adhesive;

c) said radiation is emitted through the protective sheet in order to crosslink the adhesive; and then d) a portion of the protective sheet covering the connection zone is removed for the purpose of making said zone electrically accessible, the protective layer being pulled off the connection zone by this removal or else removed by a subsequent surface treatment step, characterized in that said protective layer is based on at least one organic compound chosen from the group consisting of diamine-derived compounds and heterocyclic organometallic complexes.

2. The method as claimed in claim 1, characterized in that said or each organic compound forms part of the composition of the or each display.

3. The method as claimed in claim 1, characterized in that said protective layer has a thickness of between 5 nm and 100 nm and is deposited by an evaporation technique or a liquid technique.

4. The method as claimed in claim 1, characterized in that said protective layer has a sufficiently low adhesion to the connection zone so as to be able to be removed directly in step d) together with said portion of the sheet covered with the adhesive.

5. The method as claimed in claim 4, characterized in that said protective layer is based on a diamine derivative chosen from the group consisting of N,N'-diphenyl-N,N'-bis(1-naphthyl)-(1,1'-bisphenyl)-4,4'-diamine (NPB), N,N1-diphenyl-N,N'-bis(3-methylphenyl)-(1,1'-bisphenyl)-4,4'-diamine (TPD), 4,4'4"-tris(N-(1-naphthyl)-N-phenylamino)trisphenylamine (1T-NATA) and 4,4',4"-tris(N-(2-naphthyl)-N-phenylamino)trisphenylamine (2T-NATA).

6. The method as claimed in claim 4, characterized in that said protective layer is based on an organometallic complex derived from quinoline or benzoquinoline.

7. The method as claimed in claim 4, characterized in that said protective layer is based on an organometallic complex having an oxazole-based or thiazole-based ligand.

8. The method as claimed in claim 1, characterized in that said protective layer is removed by a mechanical tearing operation carried out in step d), this protective layer adhering sufficiently weakly to the connection zone so as to be able to be removed directly with said portion of the sheet covered with the adhesive.

9. The method as claimed in claim 1, characterized in that said protective layer is removed, after step d), in a step of dissolving it by means of a solvent appropriate to this layer.

10. The method as claimed in claim 1, characterized in that the adhesive is crosslinkable by ultraviolet radiation.

11. The method as claimed in claim 1, characterized in that the connection zone is formed by at least one alignment of connectors which is located close to a peripheral edge of the display, said substrate being a semiconductor.

12. The method as claimed in claim 1, characterized in that the protective sheet is provided with optical color filters on its face for assembly with the display, in such a way that these filters are applied in step b) facing the corresponding color dots of each of said pixels, said protective sheet being permeable to the light emitted by the display.

13. The method as claimed in claim 1, characterized in that the or each display is an electroluminescent microdisplay, preferably of the organic type, incorporating at least one organic film between two electrodes, namely the lower electrode and the upper electrode, which serve respectively as anode and cathode for the device, at least one of said electrodes being transparent to the light emitted by this microdisplay.

14. The method as claimed in claim 13, characterized in that the or each display is an OLED (organic light-emitting diode) microdisplay in which said protective layer is based on at least one organic compound used in said organic film.

15. A substrate for an electronic display device, this substrate being coated on at least one of its sides with a display, such as an OLED (organic light-emitting diode) microdisplay, which comprises an active zone formed from a matrix of pixels and an electrical connection zone, the display being intended to be fastened over substantially its entire surface via an adhesive which is crosslinkable by electromagnetic radiation, to a protective sheet which is permeable to this radiation and has an assembly face for assembly to the display, the connection zone being coated with at least one organic layer for protecting it from the adhesive, this layer being able to be removed directly from this connection zone by removing a portion of the protective sheet bonded to this zone or else by dissolution following this removal, in order to make this zone electrically accessible, characterized in that said protective layer is based on at least one organic compound chosen from the group consisting of diamine-derived compounds and heterocyclic organometallic complexes, this organic compound being used in the composition of the or each display and this protective layer preferably having a sufficiently low adhesion to the connection zone and a thickness of between 5 nm and 100 nm.

16. The method as claimed in claim 6, wherein the protective layer is selected from the group consisting of tris(8-hydroxyquinolinato)aluminum(III) (Alq3), tris(8-hydroxyquinolinato)gallium(III) (Gaq3), tris(8-hydroxyquinolinato)indium(III) (Inq3), tris(5-methyl-8-quinolinolato)aluminum (Almq3), bis(10-hydroxybenzo[h]quinolinato)beryllium (BeBq2) and biphenoxy-bi(8-quinolinolato)aluminum (BAlq).

17. The method as claimed in claim 7, wherein the protective layer is based on bis[2-(2-hydroxyphenyl)benzoxazolato]zinc (Zn(BOX)2) or bis[2-(2-hydroxyphenyl)benzothiazolato)zinc (Zn(BTZ)2).

18. The method as claimed in claim 1, wherein the adhesive is crosslinkable by ultraviolet radiation, and comprises an acrylate or epoxy.

19. The method as claimed in claim 1 wherein the connection zone is formed by at least one alignment of connectors which is located close to a peripheral edge of the display, and wherein said substrate is a semiconductor comprising silicon or silicon on glass.

20. The method as claimed in claim 12, wherein said protective sheet is made of glass or plastic.

* * * * *